United States Patent
Jeon

(10) Patent No.: US 12,027,222 B2
(45) Date of Patent: Jul. 2, 2024

(54) STORAGE DEVICE, HOST DEVICE, AND METHOD OF OPERATING THE SAME

(71) Applicant: SK hynix Inc., Gyeonggi-do (KR)

(72) Inventor: Jeong Ho Jeon, Gyeonggi-do (KR)

(73) Assignee: SK HYNIX INC., Gyeonggi-Do (KR)

( * ) Notice: Subject to any disclaimer, the term of this patent is extended or adjusted under 35 U.S.C. 154(b) by 113 days.

(21) Appl. No.: 17/748,421

(22) Filed: May 19, 2022

(65) Prior Publication Data

US 2023/0178162 A1 Jun. 8, 2023

(30) Foreign Application Priority Data

Dec. 8, 2021 (KR) .......................... 10-2021-0175075

(51) Int. Cl.
*G11C 29/08* (2006.01)
*G11C 16/04* (2006.01)
*G11C 16/08* (2006.01)

(52) U.S. Cl.
CPC .......... *G11C 29/08* (2013.01); *G11C 16/0483* (2013.01); *G11C 16/08* (2013.01)

(58) Field of Classification Search
CPC ............................. G11C 29/08; G11C 16/0483
See application file for complete search history.

(56) References Cited

U.S. PATENT DOCUMENTS

| | | | | |
|---|---|---|---|---|
| 4,334,307 | A * | 6/1982 | Bourgeois | G11C 29/10 714/E11.169 |
| 10,354,743 | B2 * | 7/2019 | Yang | G06F 11/1068 |
| 2015/0123704 | A1 * | 5/2015 | Kurokawa | H03K 19/017581 326/38 |
| 2017/0315891 | A1 * | 11/2017 | Park | G11C 29/88 |
| 2018/0210786 | A1 * | 7/2018 | Kim | G06F 11/1048 |
| 2020/0152286 | A1 * | 5/2020 | Park | G06F 11/3684 |
| 2020/0202969 | A1 * | 6/2020 | Hong | G11C 29/32 |

FOREIGN PATENT DOCUMENTS

KR 10-2017-0039451 A 4/2017
KR 10-2021-0026487 A 3/2021

* cited by examiner

*Primary Examiner* — Guy J Lamarre
(74) *Attorney, Agent, or Firm* — IP & T GROUP LLP

(57) ABSTRACT

A method of operating a host device according to the present technology includes determining an area to be tested among a mapped area and an unmapped area included in a storage area of a storage device, generating a test request corresponding to the determined area, and transmitting the generated test request to the storage device.

18 Claims, 18 Drawing Sheets

STORAGE DEVICE, HOST DEVICE, AND METHOD OF OPERATING THE SAME

CROSS-REFERENCE TO RELATED APPLICATION

The present application claims priority under 35 U.S.C. § 119(a) to Korean patent application number 10-2021-0175075, filed on Dec. 8, 2021, the entire disclosure of which is incorporated herein by reference.

BACKGROUND

1. Field of Invention

Embodiments of the present disclosure relate to an electronic device, and more particularly, to a storage device, a host device, and a method of operating the same.

2. Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed to resolve a limit of an integration degree of a two-dimensional semiconductor memory device, and may include a plurality of memory cells that are vertically stacked on a semiconductor substrate. Moreover, a controller may control an operation of the semiconductor memory device according to a request from a host device.

SUMMARY

An embodiment of the present disclosure provides a storage device, a host device, and a method of operating the same capable of efficiently performing a test operation.

According to an embodiment of the present disclosure, a method of operating a host device according to the present technology includes determining an area to be tested among a mapped area and an unmapped area included in a storage area of a storage device, generating a test request corresponding to the determined area, and transmitting the generated test request to the storage device.

According to another embodiment of the present disclosure, a method of operating a storage device includes receiving a test request from an external device, determining a data area on which a test operation is performed among a mapped area and an unmapped area included in a storage area of a storage device based on the test request, controlling a semiconductor memory device included in the storage device to read data stored in the determined data area, generating test result information based on the data read by the semiconductor memory device, and transmitting the test result information to the external device.

According to still another embodiment of the present disclosure, a storage device includes a semiconductor memory device and a controller. The semiconductor memory device includes a storage area for storing data. The controller controls an operation of the semiconductor memory device in response to a request from an external device. The controller receives a test request from the external device, determines a data area on which a test operation is performed among a mapped area and an unmapped area included in the storage area based on the test request, controls the semiconductor memory device to read data stored in the determined data area, generates test result information based on the data read by the semiconductor memory device, and transmits the test result information to the external device.

According to still another embodiment of the present disclosure, an operating method of a controller includes controlling, in response to a request from a host, a memory device to perform a read operation on at least a part of target data stored in a target area therein to measure integrity of the part read out from the target area, and providing the host with the measured integrity storage device includes a semiconductor memory device and a controller. The request indicates the target area and a range of the target data among data stored in the target region.

The present technology may provide a storage device, a host device, and a method of operating the same capable of efficiently performing a test operation.

DETAILED DESCRIPTION

The advantages and features of the present disclosure, and a method of accomplishing the advantages and features will be described through embodiments that are described in detail below together with the accompanying drawings. However, the present disclosure is not limited to the embodiments described herein but may be embodied in other forms. The present embodiments are provided to describe the technical spirit of the present disclosure in detail to those skilled in the art to which the present disclosure pertains so that those skilled in the art may easily implement the technical spirit of the present disclosure.

Figure 1:
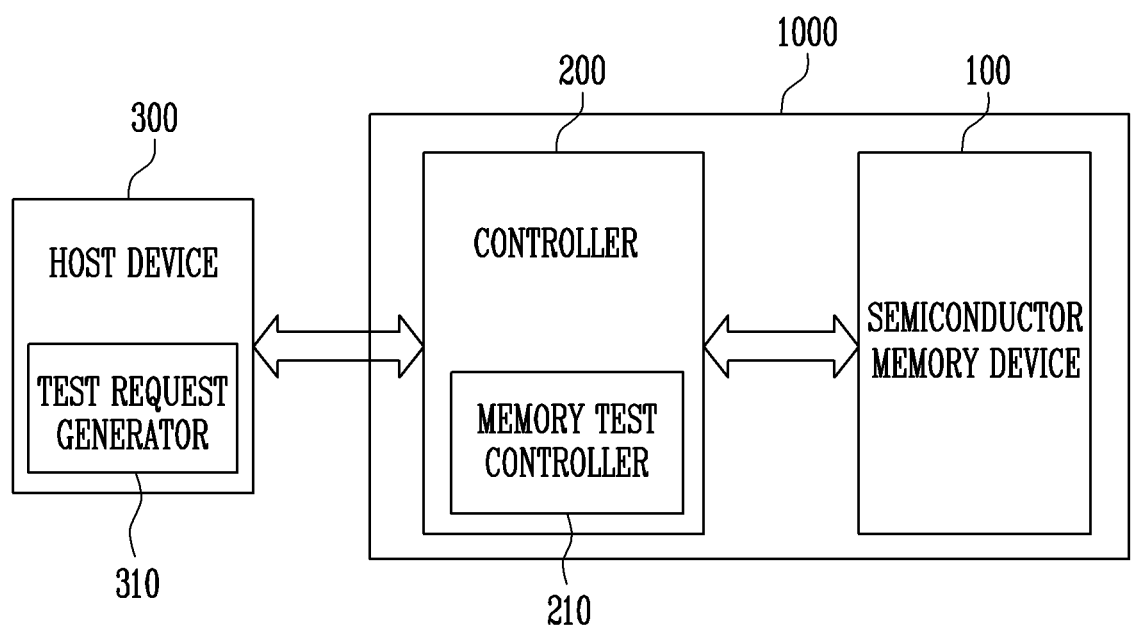
FIG. 1 is a block diagram illustrating a storage device including a controller, and a host device according to an embodiment of the present disclosure.

FIG. 1 is a block diagram illustrating a storage device 1000 including a controller 200, and a host device 300 according to an embodiment of the present disclosure.

Referring to FIG. 1, the storage device 1000 includes a semiconductor memory device 100 and a controller 200. In addition, the storage device 1000 communicates with an external device. In an embodiment, the external device may be the host device 300. In the present disclosure, the storage device 1000 communicates with the host device 300, but the present disclosure is not limited thereto. That is, in addition to the host device 300, other types of devices communicating with the storage device 1000 may also be included in the external device.

The controller 200 controls an overall operation of the semiconductor memory device 100. In addition, the controller 200 controls an operation of the semiconductor memory device 100 based on an operation request received from the host device 300.

The semiconductor memory device 100 operates under control of the controller 200. The semiconductor memory device 100 includes a memory cell array 110 having a plurality of memory blocks. In an embodiment, the semiconductor memory device 100 may be a non-volatile memory device. For example, the semiconductor memory device 100 may include at least one of a flash memory device, a phase-change random access memory (PCRAM), a magnetoresistive random access memory (MRAM), a resistive random access memory (ReRAM), and the like.

The controller 200 may receive a write request, a read request, a trim request, or the like from the host device 300, and control the semiconductor memory device 100 based on the received requests. More specifically, the controller 200 may generate commands for controlling the operation of the semiconductor memory device 100 and transmit the commands to the semiconductor memory device 100.

The semiconductor memory device 100 is configured to receive a command and an address from the controller 200 and to access an area selected by the address of the memory cell array. That is, the semiconductor memory device 100 performs an internal operation corresponding to a command on the area selected by the address.

For example, the semiconductor memory device 100 may perform a program operation, a read operation, and an erase operation. During the program operation, the semiconductor memory device 100 may program data in the area selected by the address. During the read operation, the semiconductor memory device 100 may read data from the area selected by the address. During the erase operation, the semiconductor memory device 100 may erase data stored in the area selected by the address.

The host device 300 includes a test request generator 310. The test request generator 310 may generate a test request for controlling the storage device 1000 to perform an internal test operation. The generated test request may be transmitted to the controller 200 of the storage device 1000. The controller 200 may control the semiconductor memory device 100 to perform a test operation on the memory cell array 110 of the semiconductor memory device 100 based on the received test request.

As an example, the host device 300 may generate a self-test request. The self-test request is a request for controlling the storage device 1000 to independently perform the test operation without test equipment. The storage device 1000 may perform a self-test operation in response to the self-test request received from the host device 300. The self-test request for the storage device 1000 may be used for the following purposes.

a) Start a short self-test operation (short self-test).

b) Start an extended self-test operation (extended self-test).

c) Start a vendor specific self-test operation (vendor specific self-test).

d) Abort a self-test operation that is already in progress.

The self-test operation may be performed by the controller 200 of the storage device 1000. The self-test operation may be a diagnostic test sequence for testing integrity and functionality of the controller 200 and may include a media test related to a namespace. The self-test operation may be divided into a series of segments, and each segment may be configured of a set of vendor specific tests. A segment number of a "self-test result data structure" may be used for reporting purposes to display a failure when a test is failed. In the short self-test operation and the extended self-test operation, the tests performed in each segment may be the same.

According to that described in a basic specification of NVMe, as specified in Table 1 below, a namespace identifier field may control the namespace included in the self-test operation of the storage device 1000. In order to distinguish a command from the command transmitted from the controller 200 to the semiconductor memory device 100, a term "command" described in the NVMe is replaced with "request" in the present specification.

TABLE 1

| Value | Description |
|---|---|
| 00000000h | Specifies that the self-test operation does not include the namespace and only the controller is included as a portion of the self-test operation. |
| 00000001h~FFFFFFEh | Specifies that the self-test operation includes the namespace specified in this field. When this field specifies an invalid namespace ID, the controller is required to abort the request with a status of an invalid namespace or format. When this field specifies an inactive namespace ID, the controller is required to abort the request with a status of an invalid field in the request. |
| FFFFFFFFh | Specifies that when the self-test operation is started, a device independent self-test operation includes all active namespaces accessible through the controller. |

As an example, as disclosed in Table 2 below, the self-test request may use a command Dword 10 field. In this case, all other command specific fields may be reserved.

TABLE 2

| Bits | Description |
|---|---|
| 31:04 | Reserved. |
| 03:00 | Self-test code (STC): This field specifies an operation performed by the self-test request. |

More specifically, the STC specified by the bits (03:00) of Table 2 is shown in Table 3 below.

TABLE 3

| Value | Definition |
|---|---|
| 0h | Reserved |
| 1h | Start the short self-test operation (short self-test) |
| 2h | Start the extended self-test operation (extended self-test) |
| 3h~Dh | Reserved |
| Eh | Vendor specific |
| Fh | Abort the self-test operation |

In an embodiment, according to that described in the basic specification of the NVMe, a method of processing a self-test command received according to an operation status of the storage device 1000 is defined in Table 4 below.

TABLE 4

| Self-test progress status | STC | Controller operation |
|---|---|---|
| Yes | 1h<br>2h | Abort a new self-test request as a state in which the self-test operation is in progress. |
| | Eh | Vendor Specific. |
| | Fh | The controller sequentially performs the following operations.<br>1. Stop the self-test operation that is in progress<br>2. Generate a log entry in the "newest self-test result data structure" in a self-test log.<br>3. Set a "current device self-test status" field of a "device self-test log" to 0h<br>4. Successfully complete the request |
| No | 1h | The controller sequentially performs the following operations.<br>1. Check a parameter of the request<br>2. Set the "current device self-test status" field of the "device self-test log" to 1h<br>3. Start the self-test operation<br>4. Successfully complete the request |
| | 2h | The controller sequentially performs the following operations.<br>1. Check the parameter of the request<br>2. Set the "current device self-test status" field of the "device self-test log" to 2h<br>3. Start the self-test operation<br>4. Successfully complete the request |
| | Eh | Vendor specific. |
| | Fh | Successfully complete the request. The "device self-test log" is not corrected. |

The storage device 1000 may maintain a log page related to the self-test. For example, the storage device 1000 may have a log identifier of a log page "06h" related to the self-test, and may indicate the following.
 a) The status of the device independent self-test task that is in progress and a completion rate of the corresponding task.
 b) The last 20 self-test operation results.

The self-test result data structure included in the "newest self-test result data structure" field is always the result of the last completed or aborted self-test operation. The next self-test result data structure field includes the result of the second most recent self-test operation. For example, when less than 20 self-test tasks are completed or aborted, a self-test status field of an unused self-test result data structure field may be required to be set to Fh, and all other fields in the corresponding self-test result data structure are ignored. As an example, the self-test log may be configured as shown in Table 5 below.

TABLE 5

| Bytes | Description |
|---|---|
| 00 | Current self-test operation: This field defines the current self-test operation of the storage device. Bit 7:4 is reserved. Bit 3:0 indicates the status of the current self-test operation as defined in Table 6 below. When the self-test operation is in progress (that is, this field is set to 1h or 2h), the controller is required not to set this field to 0h until the new self-test result data structure is generated (that is, when the self-test operation of the storage device 1000 is completed or aborted, the controller is required to generate the self-test result data structure before setting this field to 0h). |
| 01 | Current self-test completion: This field defines the completion status of the current self-test. Bit 7 is reserved. Bit 6:0 indicates a percentage of the completed self-test operation (for example, a value of 25 indicates that 25% of the self-test operation is completed and 75% remains). When bit 3:0 of the current self-test operation field is vacated to 0h (indicating that the self-test operation that is in progress does not exist), this field is ignored. |
| 03:02 | Reserved |
| 31:04 | The newest self-test result data structure (refer to Table 7 below) |
| 59:32 | Second most recent self-test result data structure (refer to Table 7 below) |
| . . . | . . . |
| 535:508 | Nineteenth most recent self-test result data structure (refer to Table 7 below) |
| 563:536 | Twentieth most recent self-test result data structure (refer to Table 7 below) |

TABLE 6

| Value | Definition |
|---|---|
| 0h | The self-test operation that is in progress does not exist. |
| 1h | The short self-test operation is in progress. |
| 2h | The extended self-test operation is in progress. |
| 3h~Dh | Reserved |
| Eh | Vendor Specific |
| Fh | Reserved |

TABLE 7

| Bytes | Description |
|---|---|
| 00 | Self-test status: This field indicates the self-test code and the operation status. Bit 7:4 indicates a self-test code value specified in the self-test request starting the self-test operation described by this self-test result data structure (refer to Table 3). Bit 3:0 indicates the result of the device independent self-test task described by this self-test result data structure (refer to Table 8). |
| 01 | Segment number: This field indicates a segment number where a first self-test failure occurs. This field is ignored when the self-test status field bit [3:0] is not set to 7h. |
| 02 | Valid diagnostic information: This field indicates reported diagnostic error information. Bit 3 (SC valid): When the bit 3 is set to '1', the bit 3 indicates that a content of the status code (SC) field is valid. When the bit 3 is vacated to '0', the bit 3 indicates that the content of the SC field is invalid. Bit 2 (SCT valid): When the bit 2 is set to '1', the bit 2 indicates that a content of the status code type (SCT) field is valid. When the bit 2 is vacated to '0', the bit 2 indicates that the content of the SCT field is invalid. Bit 1 (FLBA valid): When the bit 1 is set to '1', the bit 1 indicates that a content of a failed LBA (FLBA) field is valid. When the bit 1 is vacated to '0', the bit 1 indicates that the content of the FLBA field is invalid. Bit 0 (NSID Valid): When the bit 0 is set to '1', the bit 0 indicates that a content of a namespace identifier (NSID) field is valid. When the bit 0 is vacated to '0', the bit 0 indicates that the content of the NSID field is invalid. |
| 03 | Reserved |
| 11:04 | Power on hours (POH): This field indicates a power-on time of the storage device 1000 when the self-test operation is completed or aborted. The POH does not include a time when power is supplied to the controller and the controller is in a low power status. |
| 15:12 | Namespace identifier (NSID): This field indicates the namespace in which a failed LBA occurs. A content of this field is only valid when an NSID valid bit is set to '1'. |
| 23:16 | Failing LBA (FLBA): This field indicates an LBA of a logical block that causes the test to be failed. When the device finds two or more failed logical blocks during the test, this field indicates only one of the failed logical blocks. A content of this field is only valid when the FLBA valid bit is set to '1'. |
| 24 | Status code type (SCT): This field may include additional information related to an error or a condition. Bit 7:3 is reserved. Bit 2:0 may include additional information related to the error or the condition generated during the self-test operation, displayed in the same format used in an SCT field of a completion queue entry. A content of this field is valid only when the SCT valid bit is set to '1'. |
| 25 | Status Code: This field may include additional information related to the error or the condition generated during the self-test operation, displayed in the same format used in the status code (SC) field of the completion queue entry. A content of this field is valid only when the SC valid bit is set to '1'. |
| 27:26 | Vendor specific |

TABLE 8

| Value | Definition |
|---|---|
| 0h | The task is completed without an error. |
| 1h | The operation is aborted due to the self-test request. |
| 2h | The operation is aborted due to a controller level reset. |
| 3h | The operation is aborted because the namespace is removed from a namespace inventory. |
| 4h | The operation is aborted due to processing of an NVM format request. |
| 5h | A fatal or unknown test error occurs while the controller performs the self-test operation, and the operation is not completed. |
| 6h | The operation is completed, but a failed segment occurs, and the failed segment is unknown. |
| 7h | The operation is completed, but one or more failed segments occur, and the failed first segment is displayed in the segment number field. |
| 8h | The task is aborted due to an unknown reason. |
| 9h | The task is aborted due to a sanitize task. |
| Ah~Eh | Reserved |
| Fh | The entry is not used (the test result is not included) |

The self-test operation may be performed in a background. Accordingly, the self-test operation may be processed simultaneously with some requests, and the self-test operation may be required to be temporarily aborted to process another request. When receiving a request to temporarily abort the self-test operation during the self-test operation, the controller 200 aborts the self-test operation, processes and completes an operation related to the received request, and then resumes the self-test operation. During the self-test operation, performance of a subsystem of the storage device 1000 may be degraded.

As an example, the short self-test operation is required to be completed within 2 minutes. A completion rate of the short self-test operation may be displayed in a current completion rate field of a self-test log (refer to Table 5).

An abortion condition of the simple self-test operation is as follows.
 a) The self-test operation is required to be aborted by a controller level reset affecting the performed controller.
 b) The self-test operation is required to be aborted by an NVM format command.
 c) The self-test operation is required to be aborted when a sanitize operation is started.
 d) The self-test operation is required to be aborted when a self-test request in which the self-test code field is set to Fh is processed.
 e) The self-test operation may be aborted when a designated namespace is removed from the namespace inventory.

The extended self-test operation is required to be completed within a time displayed in an "extended self-test time" field of a "controller identify controller" data structure. The completion rate of the extended self-test operation may be displayed in a current completion rate field of the self-test log (refer to Table 5).

The extended self-test operation is required to persist also in a case where all controller level resets exist and is required to be restarted after the reset is completed or power recovery exists.

An abortion condition of the extensive self-test operation is as follows.
- a) The extended self-test operation is required to be aborted by the NVM format command.
- b) The extended self-test operation is required to be aborted when the sanitize operation is started.
- c) The extended self-test operation is required to be aborted when a self-test request in which the self-test code field is set to Fh is processed.
- d) The extended self-test operation may be aborted when the designated namespace is removed from the namespace inventory.

More specifically, the controller 200 includes a memory test controller 210. The memory test controller 210 receives the test request generated by the test request generator 310 of the host 300. The memory test controller 210 controls the test operation of the semiconductor memory device 100 based on the received test request. More specifically, the memory test controller 210 may generate at least one command for controlling the semiconductor memory device 100 to perform the test operation. The command generated by the memory test controller 210 is transmitted to the semiconductor memory device 100. The semiconductor memory device 100 may perform the test operation in response to the received command.

Figure 2:
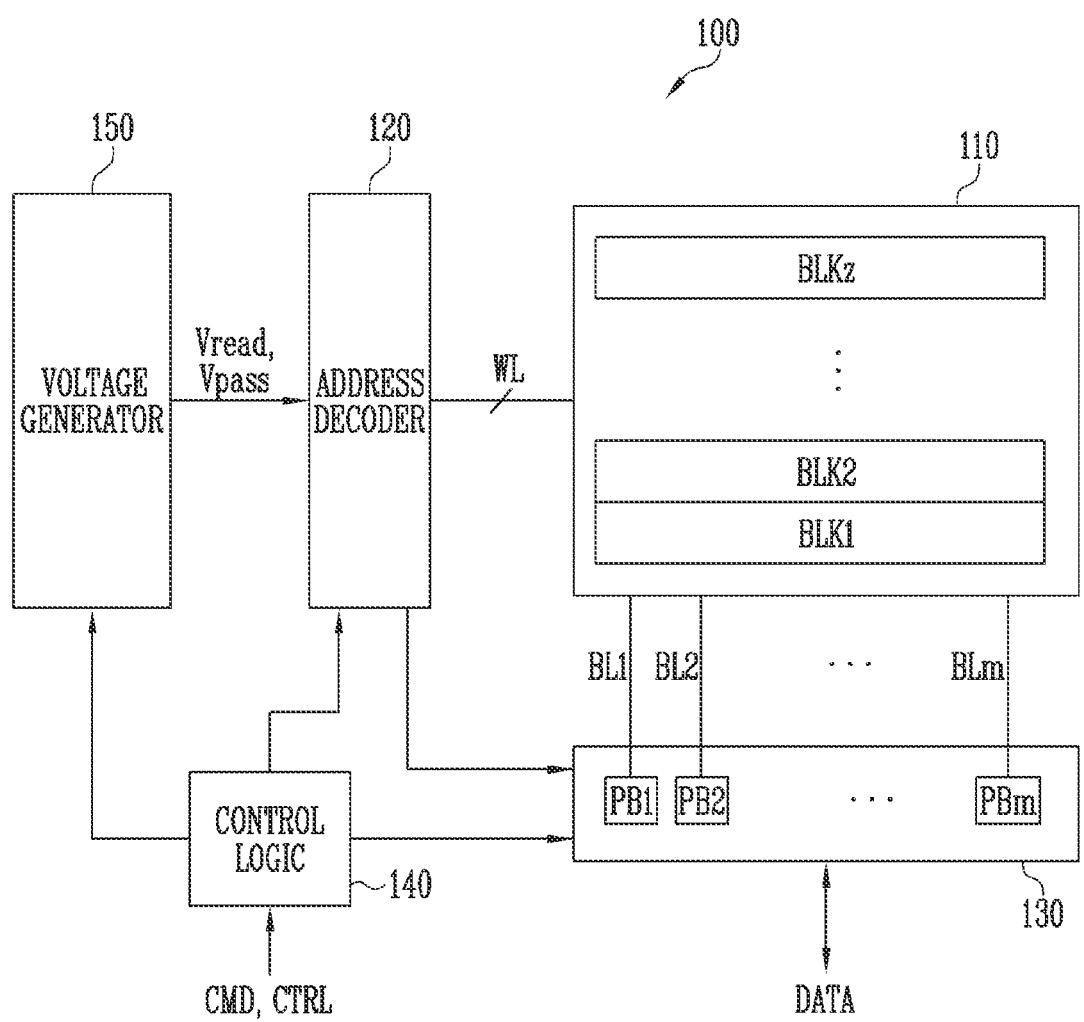
FIG. 2 is a block diagram illustrating a semiconductor memory device according to an embodiment of the present disclosure.

FIG. 2 is a block diagram illustrating a semiconductor memory device according to an embodiment of the present disclosure.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs the read operation, the write operation, and an erase operation on the memory cell array 110. The peripheral circuit performs the read operation, the write operation, and the erase operation on the memory cell array 110 based on the control of the control logic 140.

Figure 3:
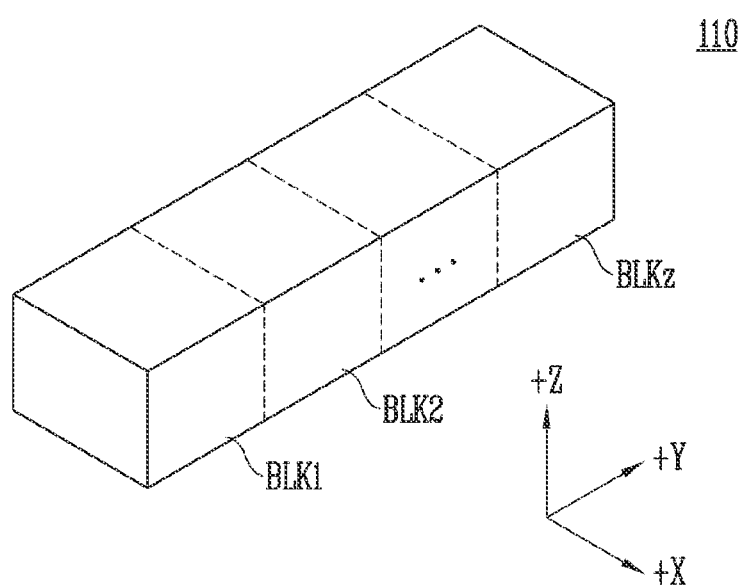
FIG. 3 is a diagram illustrating a memory cell array of FIG. 2 according to an embodiment of the present disclosure.

FIG. 3 is a diagram illustrating the memory cell array of FIG. 2 according to an embodiment of the present disclosure.

Referring to FIG. 3, the memory cell array 110 includes a plurality of memory blocks BLK1 to BLKz. Each memory block may have a three-dimensional structure. Each memory block includes a plurality of memory cells stacked on a substrate. The plurality of memory cells are arranged along a +X direction, a +Y direction, and a +Z direction. A structure of each memory block is described in more detail with reference to FIGS. 4 and 5.

Figure 4:
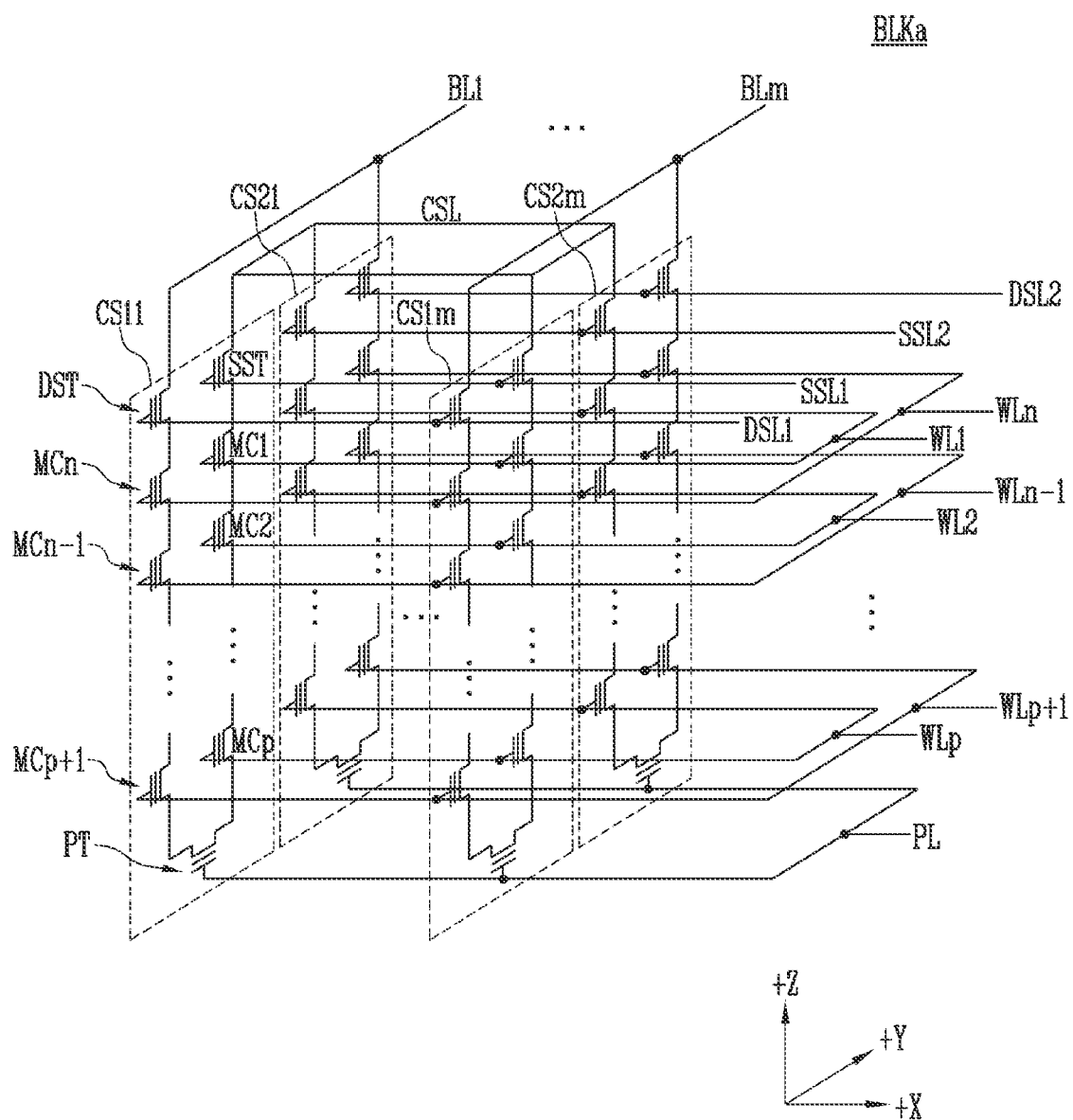
FIG. 4 is a circuit diagram illustrating a memory block BLKa among memory blocks BLK1 to BLKz of FIG. 3 according to an embodiment of the present disclosure.

FIG. 4 is a circuit diagram illustrating a memory block BLKa among the memory blocks BLK1 to BLKz of FIG. 3 according to an embodiment of the present disclosure.

Referring to FIG. 4, the memory block BLKa includes a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction, that is, the +X direction. In FIG. 4, two cell strings are arranged in a column direction, that is, the +Y direction. However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. Cell strings arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting one of the drain select lines DSL1 and DSL2. One page of the selected cell strings may be selected by selecting one of the word lines WL1 to WLn.

In another embodiment, even bit lines and odd bit lines may be provided instead of the first to m-th bit lines BL1 to BLm. In addition, even-numbered cell strings among the cell strings CS11 to CS1*m* or CS21 to CS2*m* arranged in the row direction may be connected to the even bit lines, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
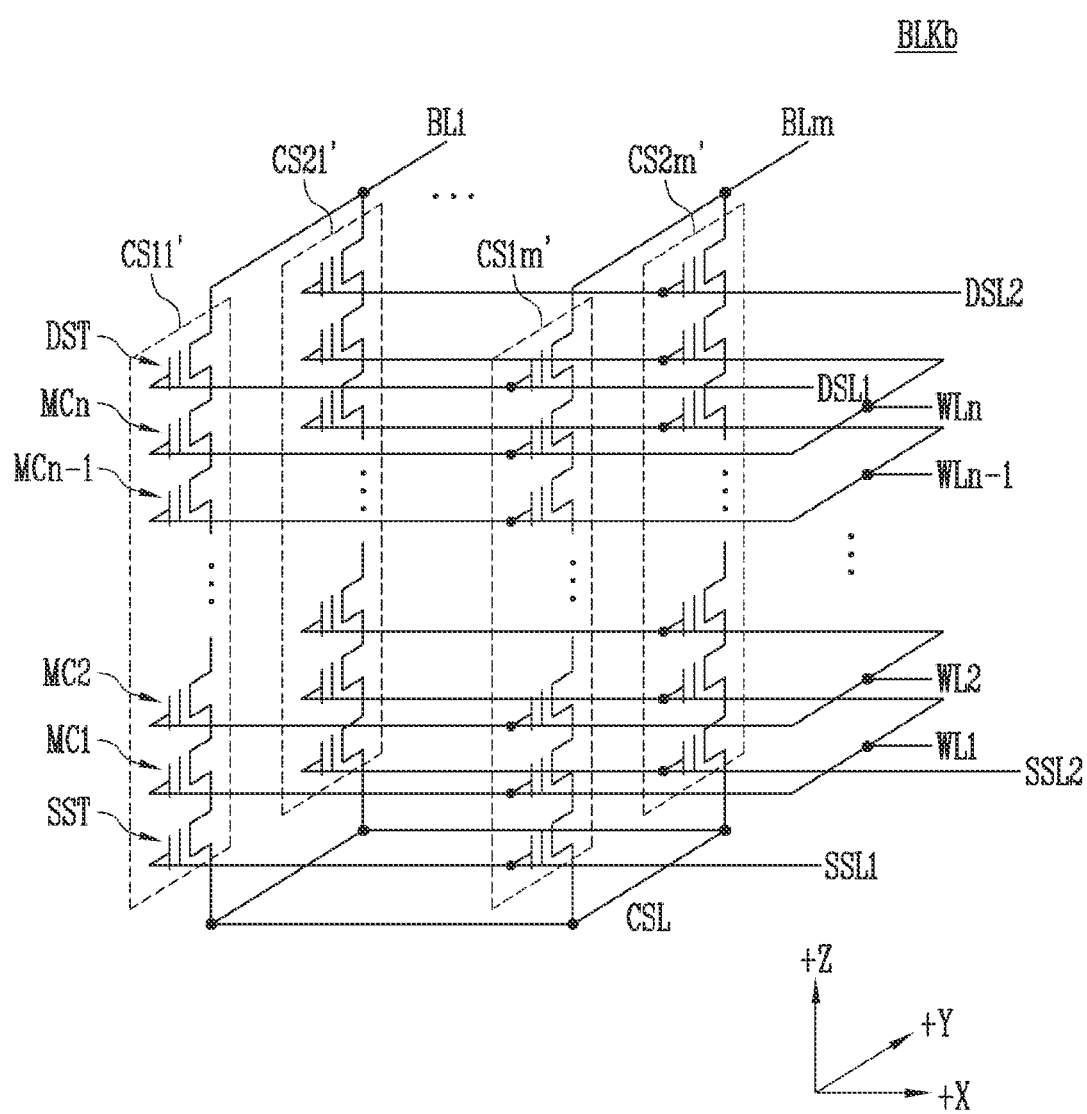
FIG. 5 is a circuit diagram illustrating a memory block BLKb among the memory blocks BLK1 to BLKz of FIG. 3 according to an embodiment of the present disclosure.

FIG. 5 is a circuit diagram illustrating a memory block BLKb among the memory blocks BLK1 to BLKz of FIG. 3 according to an embodiment of the present disclosure.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
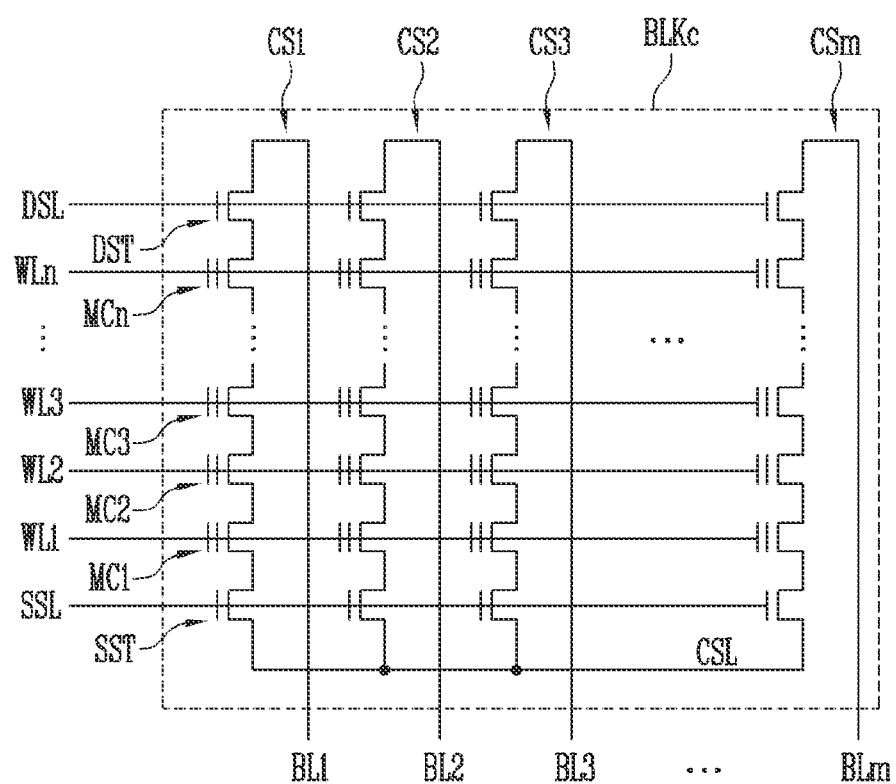
FIG. 6 is a circuit diagram illustrating a memory block BLKc among the plurality of memory blocks BLK1 to BLKz included in the memory cell array 110 of FIG. 2 according to an embodiment of the present disclosure.

FIG. 6 is a circuit diagram illustrating a memory block BLKc among the plurality of memory blocks BLK1 to BLKz included in the memory cell array 110 of FIG. 2.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
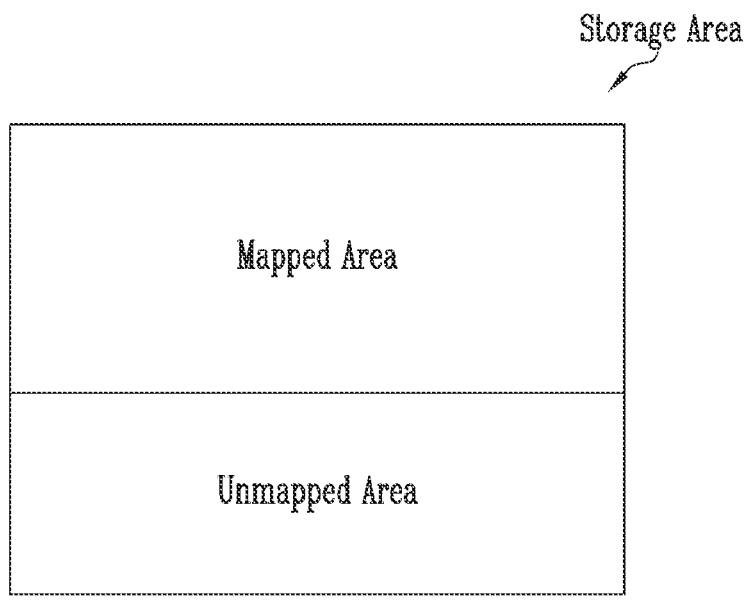
FIG. 7 is a diagram illustrating a storage area included in the storage device according to an embodiment of the present disclosure.

FIG. 7 is a diagram illustrating a storage area included in the storage device according to an embodiment of the present disclosure.

The semiconductor memory device 100 of the storage device 1000 includes the memory cell array 110, and data may be stored in the plurality of memory cells included in the memory cell array 110. Accordingly, the memory cell array 110 of the semiconductor memory device 100 may configure the storage area of the storage device 1000. The storage area may be divided into a mapped area and an unmapped area. User data received from the host device 300 may be stored in the mapped area. A position of the user data stored in the storage device 1000 may be mapped by an address of data. That is, all data stored in the mapped area may be valid data.

Furthermore, from a viewpoint of the host device 300, the unmapped area corresponds to an empty storage area. A file system of the host device 300 may recognize all unmapped areas as an empty space of the storage device 1000. However, data may be stored in the unmapped area inside the storage device. Hereinafter, the unmapped area is described in more detail with reference to FIG. 8.

Figure 8:
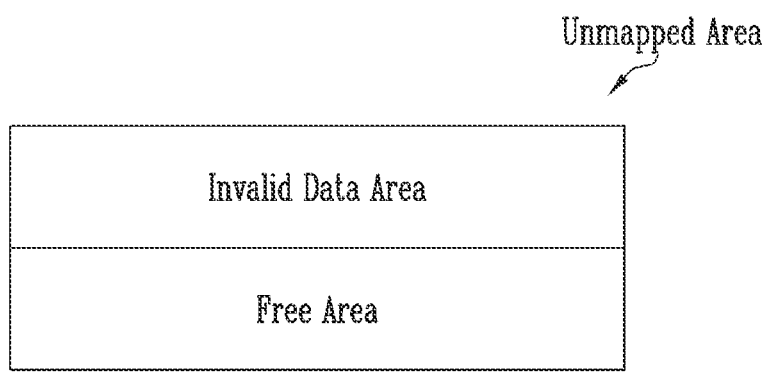
FIG. 8 is a diagram illustrating an unmapped area of the storage area included in the storage device according to an embodiment of the present disclosure.

FIG. 8 is a diagram illustrating the unmapped area of the storage area included in the storage device according to an embodiment of the present disclosure.

Referring to FIG. 8, the unmapped area may include an invalid data area and a free area. The invalid data area may be an area in which invalid data is stored, and the free area may be an area including only memory cells of an erasure state.

Data stored in the mapped area is valid data, and when address mapping of the valid data is unmapped, the data becomes the invalid data. The invalid data is data that is no longer necessary from a standpoint of the host device 300. The invalid data may be deleted by the erase operation of the storage device. When the invalid data stored in the invalid data area is deleted by the erase operation, an area corresponding to the invalid data may be changed to the free area.

Figure 9:
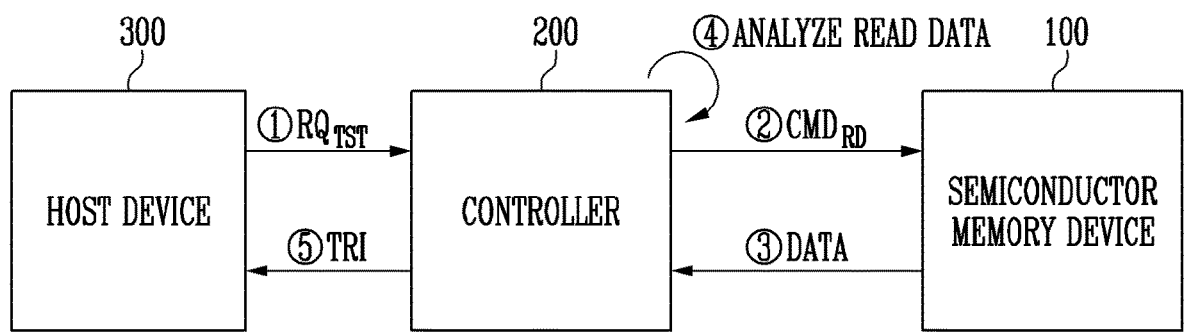
FIG. 9 is a diagram illustrating a test operation of the semiconductor memory device in response to a request from the host device according to an embodiment of the present disclosure.

FIG. 9 is a diagram illustrating the test operation of the semiconductor memory device in response to the request from the host device according to an embodiment of the present disclosure.

Referring to FIG. 9, the host device 300 transmits a test request $RQ_{TST}$ to the controller 200 of the storage device 1000 (①). The host device 300 may determine whether the storage device performs the test operation as necessary. In this case, the test request generator 310 of the host device 300 may generate the test request $RQ_{TST}$.

The test request $RQ_{TST}$ may include information on a target of the test operation to be performed by the storage device. For example, the host device 300 may determine to perform the test operation only on the mapped area of the storage area included in the storage device 1000. In this case, the test request $RQ_{TST}$ transmitted from the host device 300 to the storage device 1000 may include information indicating that the target of the test operation is the mapped area. As another example, the host device 300 may determine to perform the test operation only on the unmapped area of the storage area included in the storage device 1000. In this case, the test request $RQ_{TST}$ transmitted from the host device 300 to the storage device 1000 may include information indicating that the target of the test operation is the unmapped area.

The test request $RQ_{TST}$ may include information on the type of test operation to be performed by the storage device. For example, the host device 300 may determine that the storage device 1000 performs an entire test operation on a designated area. The "entire test" operation may refer to a test performed in a method of reading all data stored in the designated area. In this case, the test request $RQ_{TST}$ transmitted from the host device 300 to the storage device 1000 may include information indicating that the type of test operation is the entire test. As another example, the host device 300 may determine that the storage device 1000 performs a partial test operation on the designated area. The "partial test" operation may refer to a test performed in a method of reading some data among the data stored in the designated area. In this case, the test request $RQ_{TST}$ transmitted from the host device 300 to the storage device 1000 may include information indicating that the type of the test operation is the partial test.

The memory test controller 210 of the controller 200 may perform a read test operation on the semiconductor memory device 100 based on the received test request $RQ_{TST}$. Specifically, the memory test controller 210 of the controller 200 may generate the read command $CMD_{RD}$ corresponding to the received test request $RQ_{TST}$ and transmit the generated read command $CMD_{RD}$ to the semiconductor memory device 100 (②). According to an embodiment, the memory test controller 210 of the controller 200 may generate a plurality of read commands and transmit the plurality of generated read commands to the semiconductor memory device 100.

The semiconductor memory device 100 may perform the read operation in response to the received read command $CMD_{RD}$. The semiconductor memory device 100 may transmit the data DATA read as a result of the read operation to the controller 200 (③).

The controller 200 may analyze the read data DATA (④). In an embodiment, the controller 200 may perform an error correction operation on the read data DATA. When the read data DATA includes few error bits, the error correction operation may be passed on the read data DATA. When the read data DATA includes many error bits, at least one error correction operation on the read data DATA may be failed.

The controller 200 may transmit test result information TRI including an analysis result of the read data to the host device 300 (⑤). For example, the test result information TRI may include the number of error bits included in the read data DATA. As another example, the test result information TRI may include the number of failures of the error correction operation occurring on the read data DATA.

Figure 10:
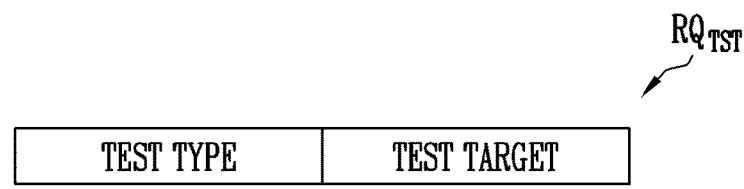
FIG. 10 is a diagram illustrating the test request received from the host device according to an embodiment of the present disclosure.

FIG. 10 is a diagram illustrating the test request received from the host device according to an embodiment of the present disclosure.

Referring to FIG. 10, the test request $RQ_{TST}$ received from the host device 300 to the storage device 1000 may include two data fields. A first data field included in the test request $RQ_{TST}$ may include information regarding the type of the test to be performed by the storage device 1000. For example, the first data field of the test request $RQ_{TST}$ may include data indicating whether the test to be performed by the storage device 1000 is the "entire test" or the "partial test". Moreover, a second data field included in the test request $RQ_{TST}$ may include information regarding an area indicated by the target of the test operation to be performed by the storage device 1000.

Figure 11A:
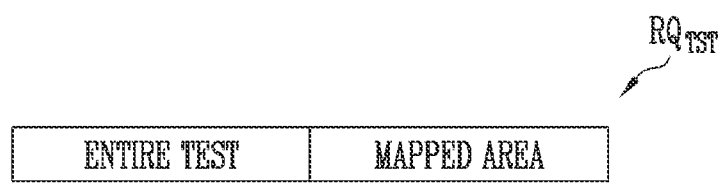
FIGS. 11A and 11B are diagrams illustrating an operation of the storage device that performs an entire test on a mapped area based on the test request from the host device according to an embodiment of the present disclosure.
Figure 11B:
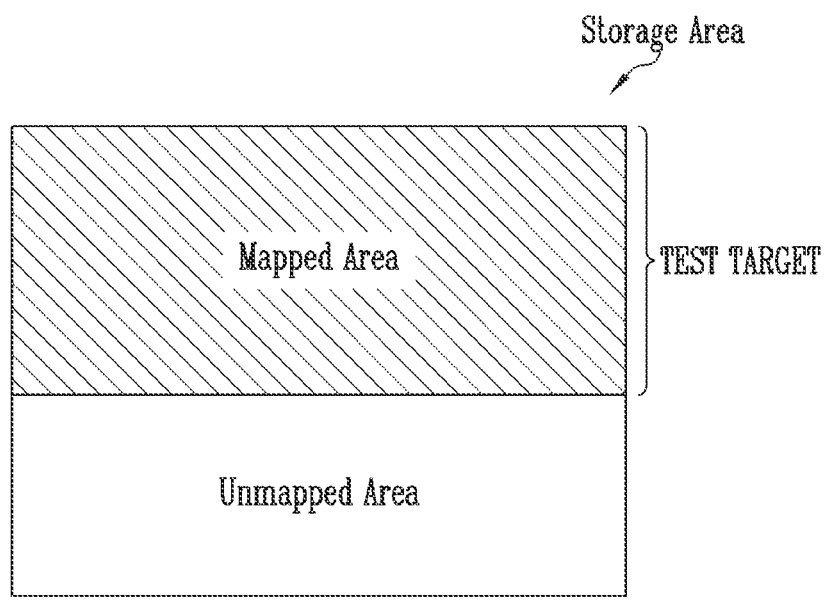

FIGS. 11A and 11B are diagrams illustrating an operation of the storage device that performs the entire test on the mapped area based on the test request from the host device according to an embodiment of the present disclosure.

Referring to FIG. 11A, the test request $RQ_{TST}$ received from the host device 300 is shown. Referring to the first data field of the test request $RQ_{TST}$ of FIG. 11A, the test operation to be performed may be the "entire test" operation. Furthermore, referring to the second data field of the test request $RQ_{TST}$ of FIG. 11A, the target of the test operation to be performed may be the mapped area.

Referring to FIG. 11B, the target of the test operation to be performed by the storage device 1000 in response to the test request $RQ_{TST}$ according to FIG. 11A is shown. Since the test operation to be performed is the "entire test" operation, and the target of the test operation to be performed is the mapped area, the entire data stored in the mapped area becomes the test target as shown in FIG. 11B. In this case, the storage device 1000 may read all data stored in the mapped area and analyze the read data. For example, the storage device may read all data stored in the mapped area and perform the error correction operation on the read data. In an embodiment, the storage device may transmit the number of error bits, an error bit rate, or the like generated as a result of the error correction operation to the host device 300 as the test operation result information TRI. In another embodiment, the storage device may count the number of failures of error correction occurring as a result of the error correction operation, and transmit a count value to the host device 300 as the test operation result information TRI.

Figure 12A:
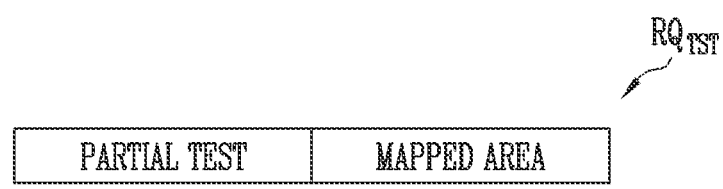
FIGS. 12A and 12B are diagrams illustrating an operation of the storage device that performs a partial test on the mapped area based on the test request from the host device according to an embodiment of the present disclosure.
Figure 12B:
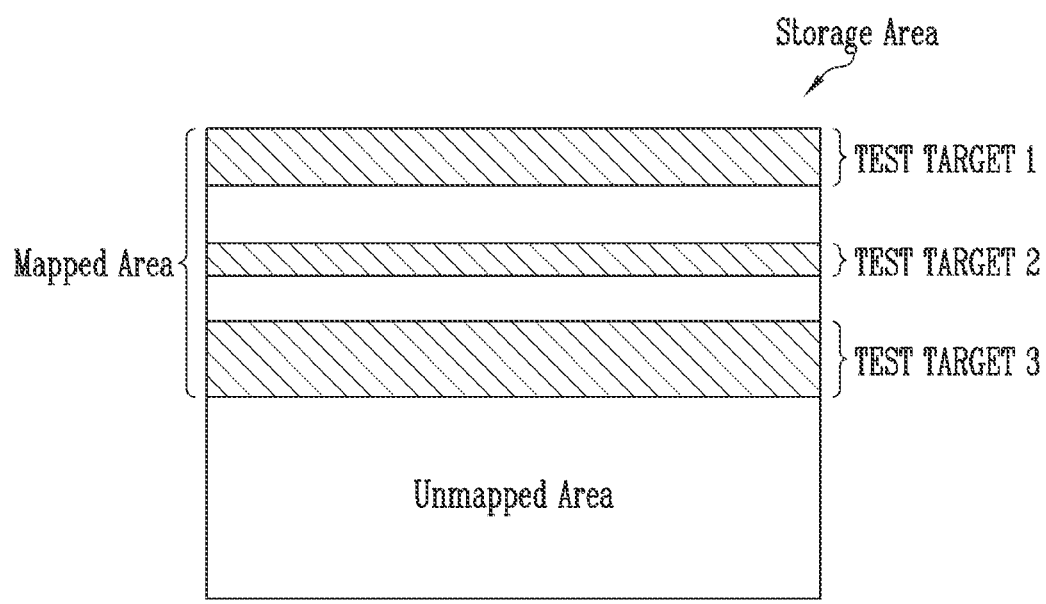

FIGS. 12A and 12B are diagrams illustrating an operation of the storage device that performs the partial test on the mapped area based on the test request from the host device according to an embodiment of the present disclosure.

Referring to FIG. 12A, the test request $RQ_{TST}$ received from the host device 300 is shown. Referring to the first data field of the test request $RQ_{TST}$ of FIG. 12A, the test operation to be performed may be the "partial test" operation. Referring to the second data field of the test request $RQ_{TST}$ of FIG. 12A, the target of the test operation to be performed may be the mapped area.

Referring to FIG. 12B, the target of the test operation to be performed by the storage device 1000 in response to the test request $RQ_{TST}$ according to FIG. 12A is shown. Since the test operation to be performed is the "partial test" operation and the target of the test operation to be performed is the mapped area, some data among the data stored in the mapped area become the test target as shown in FIG. 12B.

The storage device 1000 may sample some of the data stored in the mapped area and determine the sampled some data as the test target. In FIG. 12B, a test target 1, a test target 2, and a test target 3 are selected.

The storage device 1000 may read data corresponding to the selected test targets 1 to 3 and analyze the read data. For example, the storage device may read data corresponding to the test targets 1 to 3 stored in the mapped area and perform the error correction operation on the read data. In an embodiment, the storage device may transmit the number of error bits, the error bit rate, or the like generated as a result of the error correction operation to the host device 300 as the test operation result information TRI. In another embodiment, the storage device may count the number of error correction failures occurring as a result of the error correction operation, and transmit the count value to the host device 300 as the test operation result information TRI.

In a case of the partial test operation, a test performance time is shorter than that of the entire test operation. Therefore, in this case, the storage device 1000 may quickly generate the test result information TRI and transmit the test result information TRI to the host device 300. On the other hand, when the entire test operation is performed, the test result information TRI which is more accurate than that of the partial test operation, may be generated.

Figure 13A:
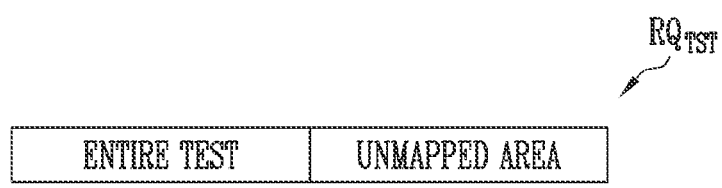
FIGS. 13A and 13B are diagrams illustrating an operation of the storage device that performs the entire test on the unmapped area based on the test request from the host device according to an embodiment of the present disclosure.
Figure 13B:
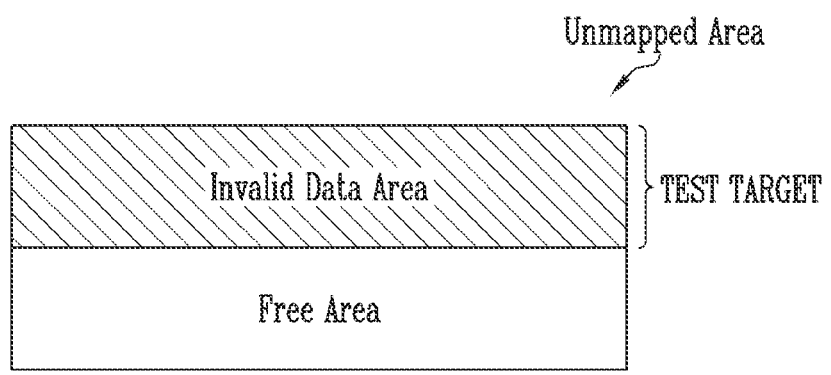

FIGS. 13A and 13B are diagrams illustrating an operation of the storage device that performs the entire test on the unmapped area based on the test request from the host device according to an embodiment of the present disclosure.

Referring to FIG. 13A, the test request $RQ_{TST}$ received from the host device 300 is shown. Referring to the first data field of the test request $RQ_{TST}$ of FIG. 13A, the test operation to be performed may be the "entire test" operation. Referring to the second data field of the test request $RQ_{TST}$ of FIG. 13A, the target of the test operation to be performed may be the unmapped area.

Referring to FIG. 13B, the target of the test operation to be performed by the storage device 1000 in response to the test request $RQ_{TST}$ according to FIG. 13A is shown. Since the test operation to be performed is the "entire test" operation and the target of the test operation to be performed is the unmapped area, entire data stored in the invalid data area of the unmapped area as shown in FIG. 13B become the test target. Since data is not stored in the free area, the free area does not become the test target.

The storage device 1000 may determine the entire data stored in the invalid data area of the unmapped area as the test target. The storage device 1000 may read the entire invalid data stored in the invalid data area and analyze the read data. For example, the storage device may read the entire invalid data stored in the invalid data area and perform the error correction operation on the read data. In an embodiment, the storage device may transmit the number of error bits, the error bit rate, or the like generated as a result of the error correction operation to the host device 300 as the test operation result information TRI. In another embodiment, the storage device may count the number of error correction failures occurring as a result of the error correction operation, and transmit the count value to the host device 300 as the test operation result information TRI.

Figure 14A:
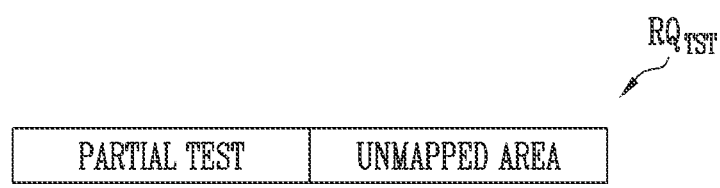
FIGS. 14A and 14B are diagrams illustrating an operation of the storage device that performs the partial test on the unmapped area based on the test request from the host device according to an embodiment of the present disclosure.
Figure 14B:
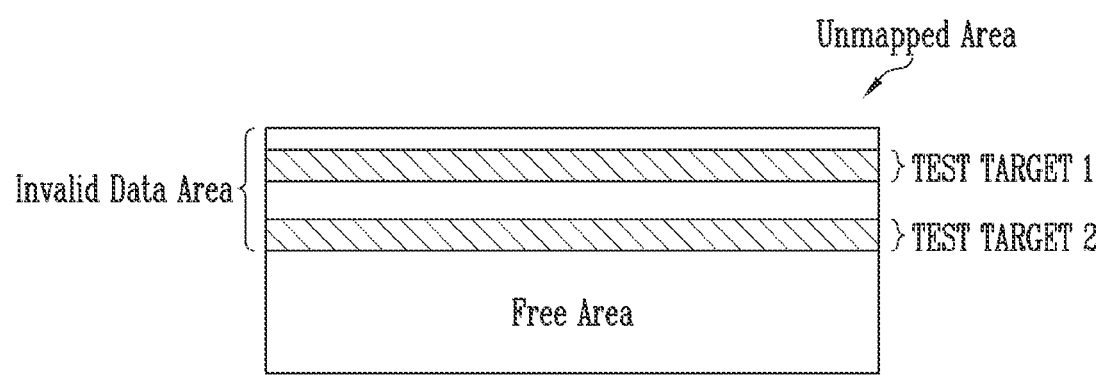

FIGS. 14A and 14B are diagrams illustrating an operation of the storage device that performs the partial test on the unmapped area based on the test request from the host device according to an embodiment of the present disclosure.

Referring to FIG. 14A, the test request $RQ_{TST}$ received from the host device 300 is shown. Referring to the first data field of the test request $RQ_{TST}$ of FIG. 14A, the test operation to be performed may be the "partial test" operation. Referring to the second data field of the test request $RQ_{TST}$ of FIG. 14A, the target of the test operation to be performed may be the unmapped area.

Referring to FIG. 14B, the target of the test operation to be performed by the storage device 1000 in response to the test request $RQ_{TST}$ according to FIG. 14A is shown. Since the test operation to be performed is the "partial test" operation, and the target of the test operation to be performed is the unmapped area, some data among the invalid data stored in the invalid data area of the unmapped area as shown in FIG. 14B become the test target.

The storage device 1000 may sample some of the invalid data stored in the invalid data area and determine the sampled some data as the test target. In FIG. 14B, a test target 1 and a test target 2 are selected.

The storage device 1000 may read data corresponding to the selected test targets 1 and 2 and analyze the read data. For example, the storage device may read invalid data corresponding to the test targets 1 and 2 stored in the invalid data area and perform the error correction operation on the read invalid data. In an embodiment, the storage device may transmit the number of error bits, the error bit rate, or the like generated as a result of the error correction operation to the host device 300 as the test operation result information TRI. In another embodiment, the storage device may count the number of error correction failures occurring as a result of the error correction operation, and transmit the count value to the host device 300 as the test operation result information TRI.

Figure 15:
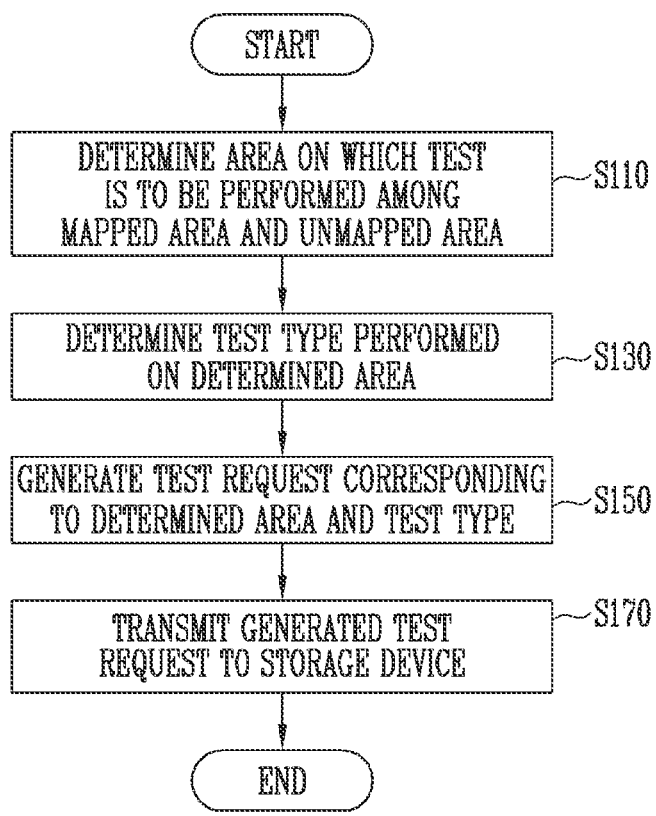
FIG. 15 is a flowchart illustrating a method of operating a host device according to an embodiment of the present disclosure.

FIG. 15 is a flowchart illustrating a method of operating a host device according to an embodiment of the present disclosure.

Referring to FIG. 15, the method of operating the host device 300 according to an embodiment of the present disclosure includes determining the area to be tested among the mapped area and the unmapped area (S110), determining the type of the test to be performed on the determined area (S130), generating the test request corresponding to the determined area and the type (S150), and transmitting the generated test request to the storage device (S170).

In operation S110, the test request generator 310 of the host device 300 may determine the area to be tested in the storage area of the storage device. As described above with reference to FIGS. 11A to 14B, the host device 300 may determine one of the mapped area and the unmapped area as the area to be tested.

In operation S130, the test request generator 310 of the host device 300 may determine the type of the test to be performed on the area determined in operation S110. As described above, the test operation may be one of the "entire test" operation and the "partial test" operation.

In operation S150, the test request generator 310 of the host device 300 generates the test request corresponding to the determined area and the type. As described above with reference to FIGS. 10 to 14B, the test request $RQ_{TST}$ may include the data field indicating the type and the data field indicating the test target area.

In operation S170, the test request generator 310 of the host device 300 transmits the generated test request to the storage device. The storage device 1000 may perform the test operation in response to the received test request. Hereinafter, a test operation of a storage device according to an embodiment of the present disclosure is described in more detail with reference to FIGS. 16 and 17.

Figure 16:
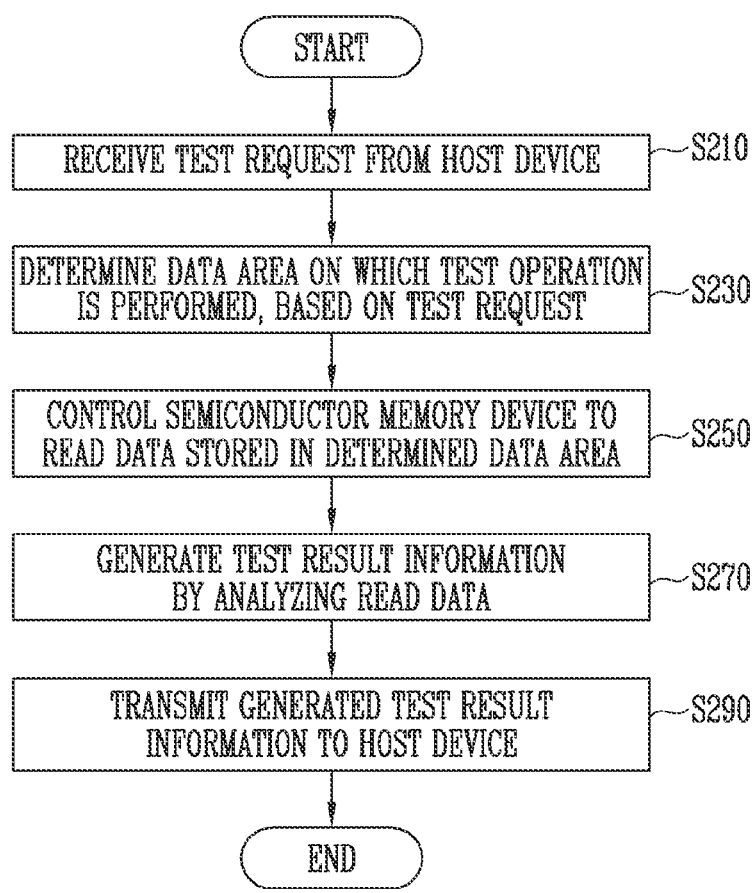
FIG. 16 is a flowchart illustrating a method of operating a storage device according to an embodiment of the present disclosure.

FIG. 16 is a flowchart illustrating a method of operating a storage device according to an embodiment of the present disclosure.

Referring to FIG. 16, the method of operating the storage device according to an embodiment of the present disclosure includes receiving the test request from the host device 300 (S210), determining the data area on which the test operation is performed based on the test request (S230), controlling the semiconductor memory device to read the data stored in the determined data area (S250), analyzing the read data to generate the test result information (S270), and transmitting the generated test result information to the host device (S290).

In operation S210, the controller 200 of the storage device 1000 receives the test request $RQ_{TST}$ from the host device 300, and in operation S230, the controller 200 determines the data area on which the test operation is performed based on the test request $RQ_{TST}$. For example, as shown in FIG. 11A, when the first data field of the test request $RQ_{TST}$ indicates the "entire test" operation and the second data field indicates the mapped area, the controller 200 may determine the entire mapped area as the data area on which the test operation is performed as shown in FIG. 11B. As another example, as shown in FIG. 14A, when the first data field of the test request $RQ_{TST}$ indicates the "partial test" operation and the second data field indicates the unmapped area, the controller 200 may determine some of the invalid data area in which the invalid data is stored in the unmapped area as the data area on which the test operation is performed as shown in FIG. 14B.

In operation S250, the controller 200 may control the semiconductor memory device to read the data stored in the determined data area. As an example, in operation S250, the controller 200 may generate at least one read command corresponding to the determined data area and transmit the generated read command to the semiconductor memory device. Operation S250 is described in more detail with reference to FIG. 17.

According to operation S250, the semiconductor memory device 100 may read the data stored in the determined data area, and transmit the read data to the controller 200. In operation S270, the controller 200 may analyze the read data to generate test result information TRI. As described above, in operation S250, the controller may perform the error correction operation on the read data. A result of performing the error correction operation may be included in the test result information TRI.

In operation S290, the controller 200 may transmit the test result information TRI to the host device 300. Accordingly, the host device 300 may utilize the test result information TRI to back up data stored in a degraded data area.

Figure 17:
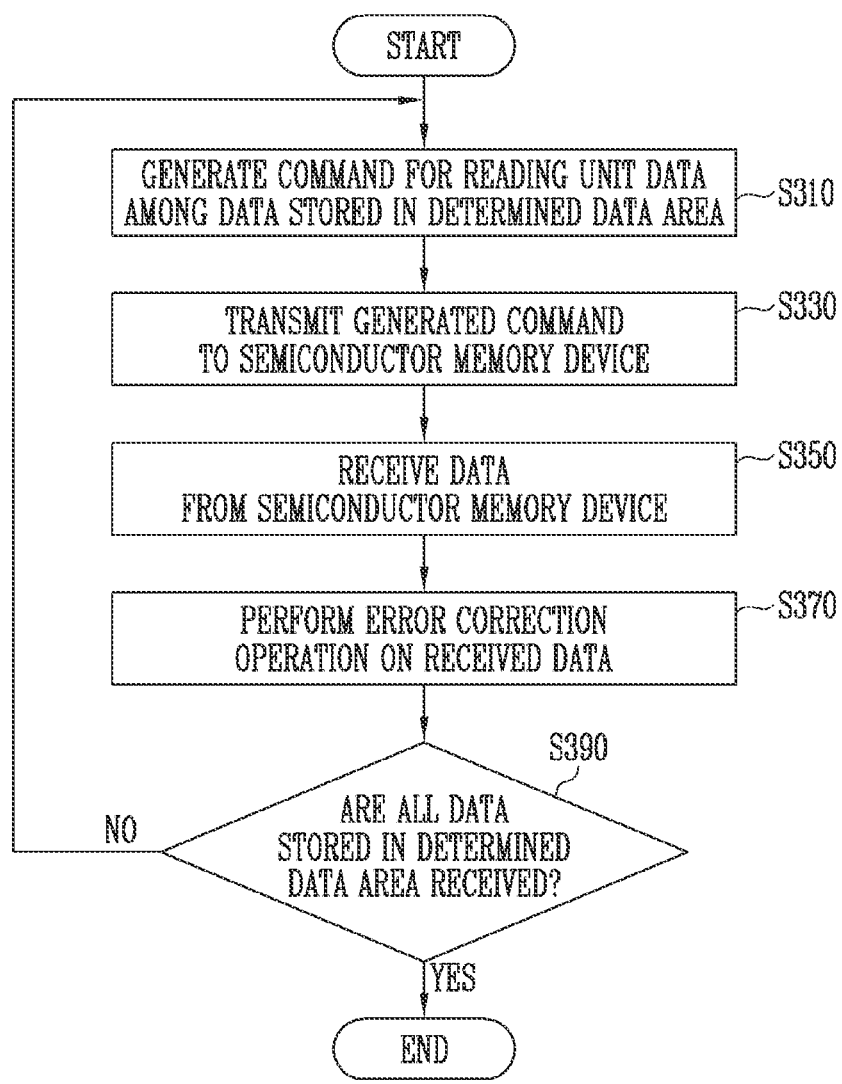
FIG. 17 is a flowchart illustrating operation S250 of FIG. 16 according to an embodiment of the present disclosure.

FIG. 17 is a flowchart illustrating operation S250 of FIG. 16 according to an embodiment of the present disclosure.

Referring to FIG. 17, operation S250 of FIG. 16 includes generating a command for reading unit data among the data stored in the determined data area (S310), transmitting the generated command to the semiconductor memory device (S330), receiving the data from the semiconductor memory device (S350), performing the error correction operation on the received data (S370), and determining whether all data stored in the determined data area are received (S390).

A plurality of pieces of unit data may be stored in the data area determined as the test target. As an example, the unit data may be page data. In operation S310, the command for reading the unit data among the data stored in the data area determined as the test target may be generated. The controller 200 may transmit the command generated in operation S330 to the semiconductor memory device. The semiconductor memory device may read corresponding unit data in response to the command, and transmit the read unit data to the controller.

In operation S350, the controller 200 receives the unit data from the semiconductor memory device. In operation S370, the controller 200 may perform the error correction operation on the received unit data. In operation S390, the controller 200 determines whether all data stored in the determined data area are received. When all data stored in the determined data area are received (S390: Yes), operation S250 is ended. When the all data stored in the determined data area are not received (S390: No), the process returns to operation S310 to generate a command for reading another unit data. Thereafter, steps S330, S350, S370, and S390 may be repeatedly performed.

Figure 18:
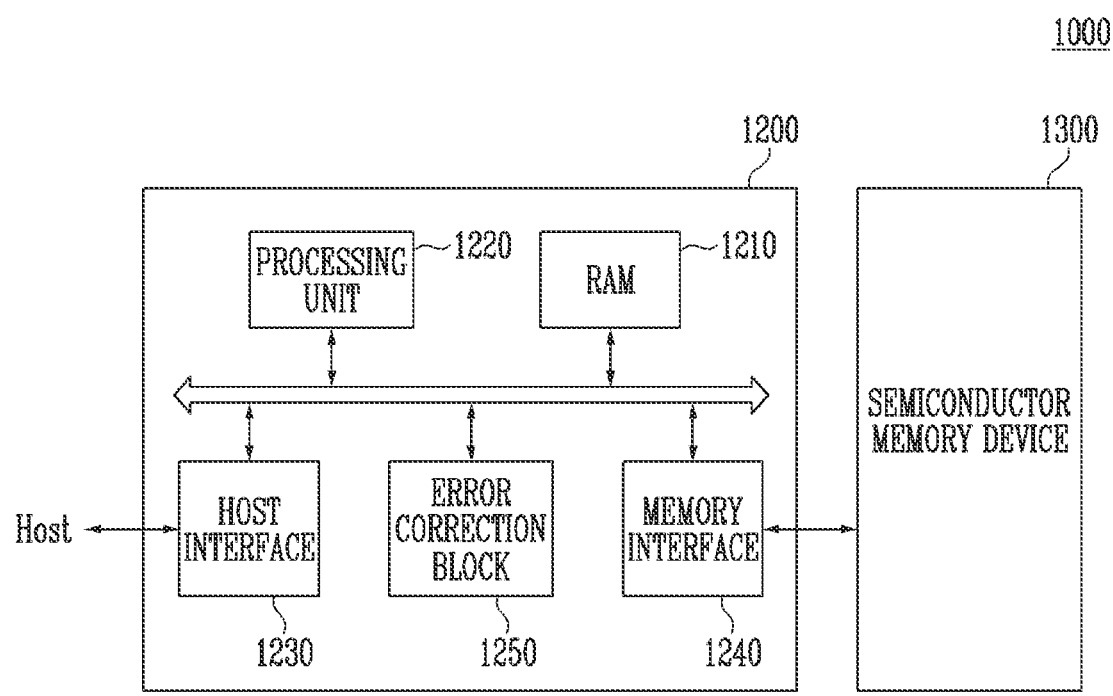
FIG. 18 is a block diagram illustrating a storage device including a semiconductor memory device and a controller according to an embodiment of the present disclosure.

FIG. 18 is a block diagram illustrating a storage device including a semiconductor memory device and a controller according to an embodiment of the present disclosure.

The semiconductor memory device 1300 of FIG. 18 may be configured and may operate similarly to the semiconductor memory device 100 described with reference to FIG. 2.

The controller 1200 is connected to a host device Host and the semiconductor memory device 1300. The controller 1200 is configured to access the semiconductor memory device 1300 in response to a request from the host device Host. For example, the controller 1200 is configured to control read, program, erase, and background operations of the semiconductor memory device 1300. The controller 1200 is configured to provide an interface between the semiconductor memory device 1300 and the host device Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as one of an operation memory of the processing unit 1220, a cache memory between the semiconductor memory device 1300 and the host device Host, and a buffer memory between the semiconductor memory device 1300 and the host device Host.

The processing unit 1220 controls an overall operation of the controller 1200. The processing unit 1220 is configured to control the read program, erase, and background operations of the semiconductor memory device 1300. The processing unit 1220 is configured to drive firmware for controlling the semiconductor memory device 1300. The processing unit 1220 may perform a function of a flash translation layer (FTL). The processing unit 1220 may convert a logical block address (LBA) provided by the host device into a physical block address (PBA) through the FTL. The FTL may receive the logical block address (LBA) and convert the LBA into the PBA by using a mapping table. There are several address mapping methods of the FTL according to a mapping unit. A representative address mapping method includes a page mapping method, a block mapping method, and a hybrid mapping method.

The host interface 1230 includes a protocol for performing data exchange between the host device Host and the controller 1200. In an embodiment, the controller 1200 is configured to communicate with the host device Host through at least one of various communication standards or interfaces such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 includes a NAND interface or a NOR interface.

The error correction block 1250 is configured to detect and correct an error of data received from the semiconductor memory device 1300 using an error correcting code (ECC). The error correction block 1250 may correct an error by using the ECC on read page data. The error correction block 1250 may correct an error by using a coded modulation such as a low density parity check (LDPC) code, a Bose, Chaudhri, Hocquenghem (BCH) code, a turbo code, a Reed-Solomon code, a convolution code, a recursive systematic code (RSC), a trellis-coded modulation (TCM), a block coded modulation (BCM), and a hamming code.

During a read operation, the error correction block 1250 may correct an error of the read page data. Decoding may be failed when the read page data includes error bits that exceed a correctable number of bits. The decoding may be successful when the page data includes error bits equal to or less than the correctable number of bits. The success of the decoding indicates that a read command is passed. The failure of the decoding indicates that the read command is failed. When the decoding is successful, the controller 1200 outputs the page data in which the error is corrected to the host.

The controller 200 of FIG. 1 may be implemented as the controller 1200 shown in FIG. 18. In this case, the memory test controller 210 of FIG. 1 may be implemented as firmware driven by the processing unit 1220.

The controller 1200 and the semiconductor memory device 1300 may be integrated into one semiconductor device. In an embodiment, the controller 1200 and the semiconductor memory device 1300 may be integrated into one semiconductor device to configure a memory card. For example, the controller 1200 and the semiconductor memory device 1300 may be integrated into one semiconductor device to configure a memory card such as a PC card (personal computer memory card international association (PCMCIA)), a compact flash (CF) card, a smart media card (SM or SMC), a memory stick, a multimedia card (MMC, RS-MMC, or MMCmicro), a secure digital (SD) card (SD, miniSD, microSD, or SDHC), and a universal flash storage (UFS).

The controller 1200 and the semiconductor memory device 1300 may be integrated into one semiconductor device to configure a semiconductor drive (solid state drive (SSD)). The semiconductor drive (SSD) includes a storage device configured to store data in the semiconductor memory. When the storage device is used as the semiconductor drive (SSD), an operation speed of the host device Host connected to the storage device is dramatically improved.

As another example, the storage device 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 1300 or the storage device may be mounted as a package of various types. For example, the semiconductor memory device 1300 or the storage device may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC) package, a shrink small outline package (SSOP), a thin small outline package (TSOP), a system in package (SIP), a multi-chip package (MCP), a wafer-level fabricated package (WFP), or a wafer-level processed stack package (WSP).

Figure 19:
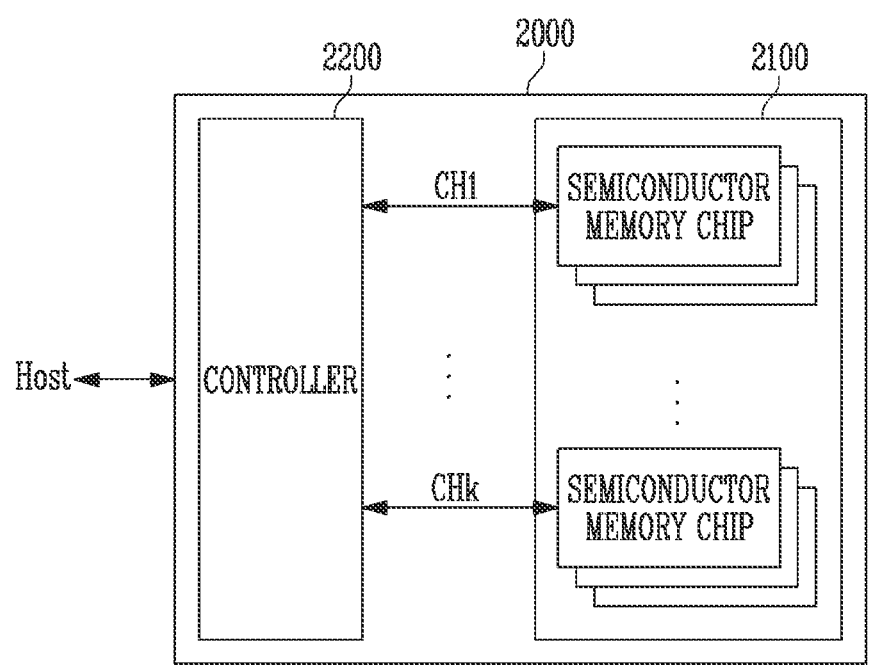
FIG. 19 is a block diagram illustrating an application example of the storage device of FIG. 18 according to an embodiment of the present disclosure.

FIG. 19 is a block diagram illustrating an application example 2000 of the storage device of FIG. 18 according to an embodiment of the present disclosure.

Referring to FIG. 19, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 19, the plurality of groups communicate with the controller 2200 through first to k-th channels CH1 to CHk, respectively. Each semiconductor memory chip is configured and is operated similarly to one of the semiconductor memory device 1300 described with reference to FIG. 18.

Each group is configured to communicate with the controller 2200 through one common channel. The controller 2200 is configured similarly to the controller 1200 described with reference to FIG. 18 and is configured to control the plurality of memory chips of the semiconductor memory device 2100 through the plurality of channels CH1 to CHk.

In FIG. 19, the plurality of semiconductor memory chips are connected to one channel. However, it will be understood that the storage device 2000 may be modified so that one semiconductor memory chip is connected to one channel.

Figure 20:
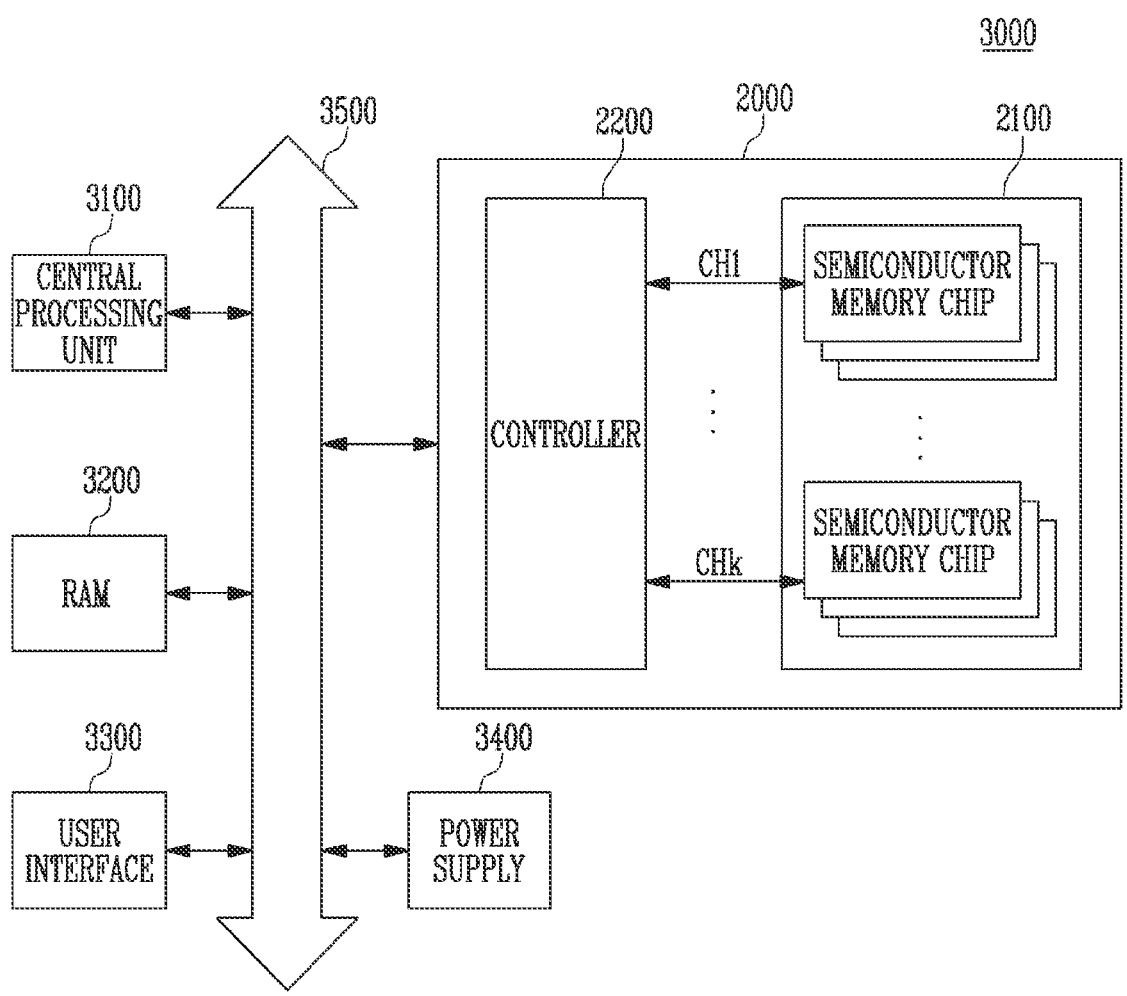
FIG. 20 is a block diagram illustrating a computing system including the storage device described with reference to FIG. 19 according to an embodiment of the present disclosure.

FIG. 20 is a block diagram illustrating a computing system including the storage device described with reference to FIG. 19 according to an embodiment of the present disclosure.

Referring to FIG. 20, the computing system 3000 includes a central processing unit 3100, a random access memory (RAM) 3200, a user interface 3300, a power supply 3400, a system bus 3500, and the storage device 2000.

The storage device 2000 is electrically connected to the central processing unit 3100, the RAM 3200, the user interface 3300, and the power supply 3400 through the system bus 3500. Data provided through the user interface 3300 or processed by the central processing unit 3100 is stored in the storage device 2000.

In FIG. 20, the semiconductor memory chip 2100 is connected to the system bus 3500 through the controller 2200. However, the semiconductor memory chip 2100 may be configured to be directly connected to the system bus 3500. At this time, a function of the controller 2200 is performed by the central processing unit 3100 and the RAM 3200.

In FIG. 20, the storage device 2000 described with reference to FIG. 19 is provided. However, the storage device 2000 may be replaced with the storage device 1000 described with reference to FIG. 18. In an embodiment, the computing system 3000 may be configured to include both of the storage devices 1000 and 2000 described with reference to FIGS. 18 and 19.

The embodiments of the present disclosure disclosed in the present specification and drawings are merely provided with specific examples to easily describe the technical content of the present disclosure and to help understanding of the present disclosure, and are not intended to limit the scope of the present disclosure. It will be apparent to those of ordinary skill in the art that other modified examples based on the technical spirit of the present disclosure may be implemented in addition to the embodiments disclosed herein and the following claims. Furthermore, the embodiments may be combined to form additional embodiments.

What is claimed is:

1. A method of operating a host device, the method comprising:
   determining an area to be tested among a mapped area or an unmapped area included in a storage area of a storage device;
   generating a test request corresponding to the determined area; and
   transmitting the generated test request to the storage device,
   wherein the mapped area stores valid data to which an address is mapped, and
   wherein the unmapped area stores invalid data from which the address of the valid data is unmapped.

2. The method of claim 1, wherein the unmapped area includes an invalid data area and a free area, and the invalid data is stored in the invalid data area.

3. The method of claim 1, further comprising determining a type of a test to be performed on the determined area after the determining of the area to be tested.

4. The method of claim 3,
   wherein the determining of the type of the test comprises selecting one of an entire test for performing the test on entire data stored in the determined area and a partial test for performing the test on partial data among data stored in the determined area, and
   wherein the test request includes information of the determined area and the type.

5. The method of claim 1, wherein the test request indicates an operation of reading data stored in the determined area and an error correction operation on the read data.

6. The method of claim 3, wherein the test request includes a first data field and a second data field, the first data field indicates the area to be tested, and the second data field indicates the determined type.

7. A method of operating a storage device, the method comprising:
   receiving a test request from an external device;
   determining a data area on which a test operation is performed among a mapped area or an unmapped area included in a storage area of a storage device based on the test request;
   controlling a semiconductor memory device included in the storage device to perform the test operation of reading data stored in the determined data area;
   generating result information of the test operation based on the data read by the semiconductor memory device; and
   transmitting the result information to the external device,
   wherein the mapped area stores valid data to which an address is mapped, and
   wherein the unmapped area stores invalid data from which the address of the valid data is unmapped.

8. The method of claim 7, wherein the unmapped area includes an invalid data area and a free area, and the invalid data is stored in the invalid data area.

9. The method of claim 7,
   wherein the test request includes a first field indicating the data area on which the test operation is performed and a second field indicating a type of the test operation to be performed by the storage device, and
   wherein the type of the test operation includes an entire test and a partial test.

10. The method of claim 7, wherein the controlling comprises:
    generating a command for reading unit data among the data stored in the determined data area;
    transmitting, to the semiconductor memory device, the generated command from a controller included in the storage device;
    receiving, by the controller, the read data from the semiconductor memory device; and performing an error correction operation on the read data.

11. The method of claim 10, wherein the generating of the result information comprises generating the result information based on a result of the performing of the error correction operation.

12. The method of claim 11, wherein the result information is a number of error bits in the unit data read from the determined data area.

13. The method of claim 11, wherein the result information is a number of times that an error correction fails during the error correction operation.

14. The method of claim 10, wherein the unit data is page data.

15. A storage device comprising:
a semiconductor memory device including a storage area for storing data; and
a controller configured to:
receive a test request from an external device,
determine a data area on which a test operation is performed among a mapped area or an unmapped area included in the storage area based on the test request,
control the semiconductor memory device to perform the test operation of reading data stored in the determined data area,
generate result information of the test operation based on the data read by the semiconductor memory device, and
transmit the result information to the external device,
wherein the mapped area stores valid data to which an address is mapped, and
wherein the unmapped area stores invalid data from which the address of the valid data is unmapped.

16. The storage device of claim 15, wherein the unmapped area includes an invalid data area and a free area, and wherein the invalid data is stored in the invalid data area.

17. The storage device of claim 15,
wherein the controller controls the semiconductor memory device to perform the test operation of reading the data by performing an error correction operation on the read data, and
wherein the controller generates the result information based on a result of the error correction operation.

18. The storage device of claim 17, wherein the result information includes information on at least one of a number of error bits in the data read from the determined data area and a number of times that an error correction fails during the error correction operation.

\* \* \* \* \*